United States Patent [19]
Bowden

[11] Patent Number: 6,052,809
[45] Date of Patent: Apr. 18, 2000

[54] METHOD FOR GENERATING TEST PATTERNS

[75] Inventor: Kenneth R. Bowden, Marblehead, Mass.

[73] Assignee: Teradyne, Inc., Boston, Mass.

[21] Appl. No.: 08/951,782

[22] Filed: Oct. 16, 1997

[51] Int. Cl.[7] .................................................. G01R 31/28
[52] U.S. Cl. .......................................... 714/738; 714/741
[58] Field of Search .................................. 714/28, 30, 33, 714/736, 738, 741, 742; 364/264.3, 933.8, 578, 580; 395/500

[56] References Cited

U.S. PATENT DOCUMENTS

| | | | |
|---|---|---|---|
| 4,773,028 | 9/1988 | Tallman | 364/550 |
| 4,860,291 | 8/1989 | Damm et al. | 371/27 |
| 5,029,171 | 7/1991 | Lee et al. | 371/27 |
| 5,177,440 | 1/1993 | Walker, III et al. | 324/158 R |
| 5,596,587 | 1/1997 | Douglas et al. | 371/27 |
| 5,640,403 | 6/1997 | Ishiyama et al. | 714/737 |
| 5,790,836 | 8/1998 | Mizumo | 395/500 |

*Primary Examiner*—Trinh L. Tu

[57] ABSTRACT

A method for generating test patterns for testing digital electronic circuits, whereby a test pattern template is defined that fully specifies some primary inputs while other primary inputs are specified in accordance with selected series of codes. The test pattern template is then repeatedly converted into a stimulus pattern using different integers in the selected series of codes, and fault simulation is performed on a circuit under test using each stimulus pattern. A stimulus pattern is then saved for subsequent testing of the circuit under test whenever fault simulation using that stimulus pattern shows that fault coverage has increased. The method significantly reduces the number of primary input combinations required for generating test patterns.

24 Claims, 4 Drawing Sheets

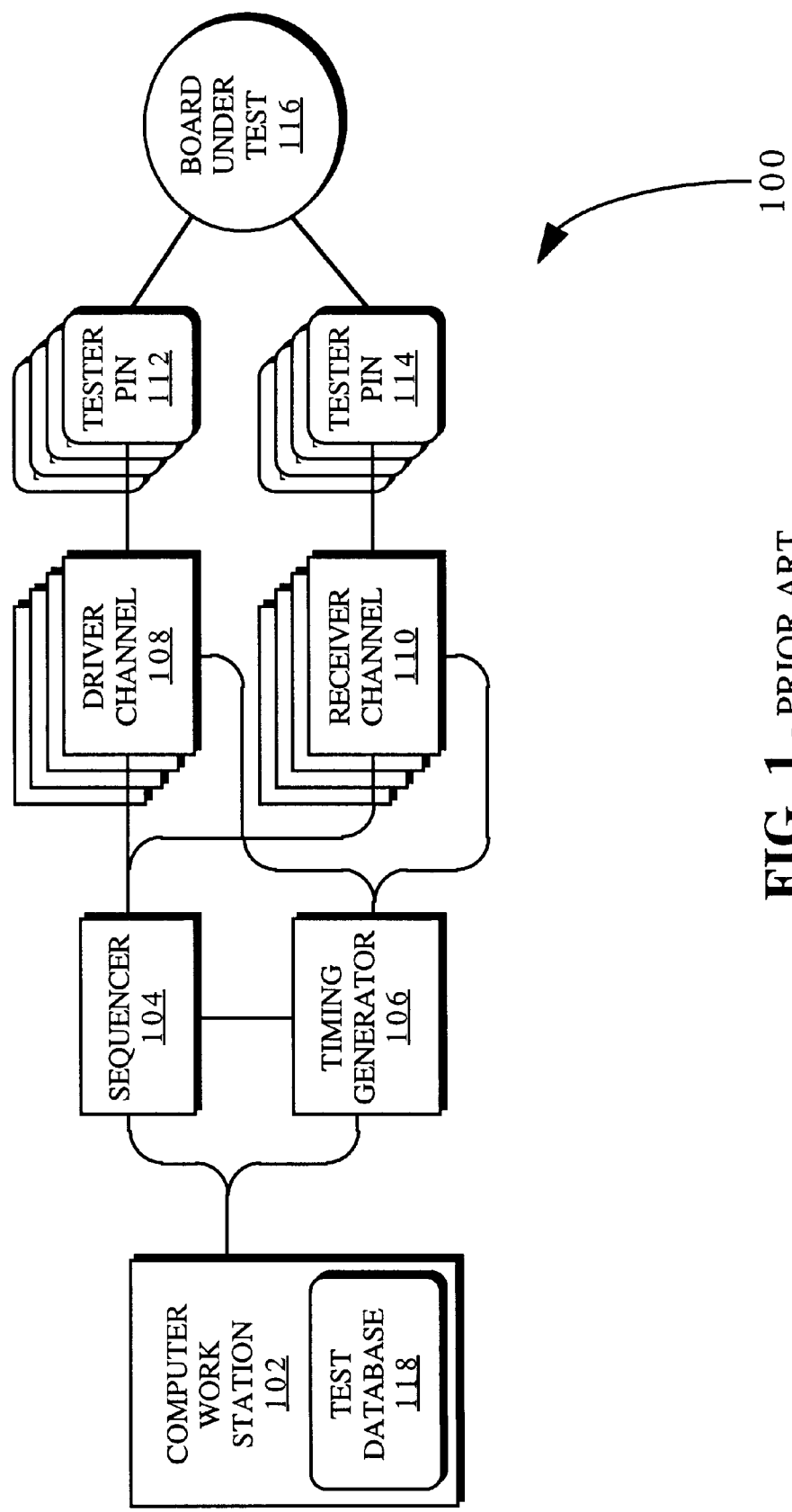
FIG. 1 - PRIOR ART

METHOD FOR GENERATING TEST PATTERNS

This invention relates generally to automatic test equipment, and more specifically to test pattern generation for testing digital electronic circuits.

Digital semiconductor devices and printed circuit boards are commonly tested using automatic test equipment (testers). Testers generally include computerized control circuitry, driver and receiver channels, and tester pins, which connect electrical nodes of a device under test (DUT), or primary inputs/outputs of a board under test (BUT), to the driver and receiver channels.

During a typical test session, testers generally apply test signals to the DUT or BUT, receive output signals produced by the DUT or BUT in response to the test signals, and compare the output signals with expected output signals.

Both the test signals and the expected output signals are typically specified by a set of test vectors, which is also known as a test pattern set. Each test vector is generally in digital form and provides information about a data value, timing, and format of each test signal and expected output signal during a test cycle. For example, the data value of a signal during a particular test cycle may be specified as either high or low, the timing of the signal may be specified as a delay relative to the beginning of the test cycle, and the format may indicate that the signal is to be either applied to or observed at a particular node of the DUT, or at a particular primary input/output of the BUT.

Testers generally detect defects in the DUT or BUT whenever the received output signals do not match the expected output signals. Such defects are also known as faults. The detected faults typically include nodes that are either "stuck-at-1" or "stuck-at-0," high nodal capacitances that cause slow response times, open connections between nodes, and shorted nodes.

Because testers that are designed for detecting faults in VLSI devices and complex boards may execute test pattern sets consisting of over one million test vectors, test program development frequently becomes a tedious exercise for a test engineer.

Current methods used by test engineers for developing test programs range from "brute force" approaches to "fault-specific" approaches. For example, a typical brute force approach may include generating test vectors for applying all possible input combinations to the DUT or BUT, for specifying all related expected output signals, and for repeatedly identifying those input combinations that detect new faults until all potential faults for the DUT or BUT are detected. The identified input combinations and related expected output signals are then typically converted to a test pattern set, which is saved as a test program for subsequent testing.

However, because thousands and often millions of input combinations may be required for developing test programs for VLSI devices and complex boards, the brute force approaches are generally slow and inefficient. This is because the input combinations would necessarily include all combinations of the data value, timing, and format information for each test vector in the test pattern sets. For example, a BUT with 20 primary inputs has on the order of one million (i.e., $2^{20}$) possible input combinations.

Further, a typical fault-specific approach includes generating test vectors for detecting each potential fault on the DUT or BUT, identifying those test vectors that detect each fault, converting the identified test vectors to a test pattern set, and saving the test pattern set as a test program for subsequent testing.

However, the fault-specific approaches can also be slow and inefficient. This is because some potential faults might be easy to detect, while other potential faults might be difficult to detect. As a result, an inordinate amount of time is often spent generating test vectors for detecting the "difficult faults."

It would therefore be desirable to have a method for generating test pattern sets that can be used for detecting potential faults on digital devices and printed circuit boards. It would also be desirable to have a method for generating test patterns that is more efficient than the current methods and is easy to implement.

SUMMARY OF THE INVENTION

With the foregoing background in mind, it is an object of the invention to generate test pattern sets for detecting potential faults on digital semiconductor devices and printed circuit boards.

Another object of the invention is to provide a method for generating the test pattern sets that both decreases the time required to generate the test pattern sets and is easy to implement.

The foregoing and other objects are achieved by defining a test pattern template, wherein timing and data values are fully specified for a first plurality of primary inputs, and wherein timing and data values are specified for a second plurality of primary inputs in accordance with a predetermined series of codes. The test pattern template is then converted into a stimulus pattern. Next, a digital electronic circuit is simulated using the stimulus pattern for producing an expected output pattern. The digital electronic circuit is then fault simulated using the stimulus pattern and the expected output pattern; and, if fault coverage increases, then the stimulus pattern and the expected output pattern are saved for subsequent testing of the digital electronic circuit.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a simplified block diagram of a prior art tester in a typical test configuration.

DESCRIPTION OF THE PREFERRED EMBODIMENT

Figure 2A:
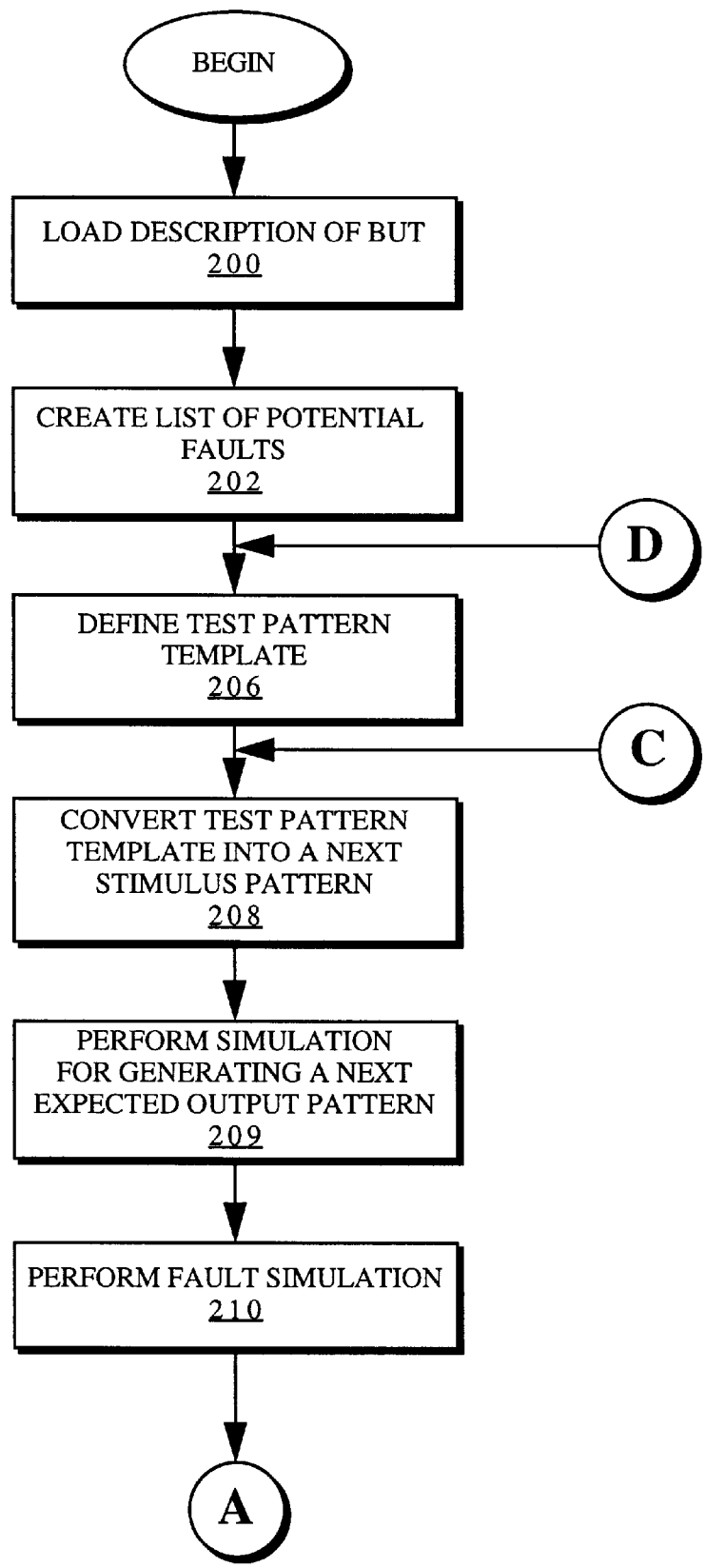
FIGS. 2A through 2C is a flowchart representation of a method for generating a test pattern set in accordance with the present invention.

FIG. 1 shows a simplified block diagram of a tester 100 in a conventional test configuration. A test engineer develops test programs, which typically consist of test pattern sets, on a computer work station 102. The test engineer then loads each test program into a memory (not shown), which is generally included in a sequencer 104.

For each test cycle, the sequencer 104 reads one test vector from the memory, and then provides data value, timing, and format information to a plurality of driver channels and a plurality of receiver channels. The sequencer 104 also sends timing information to a timing generator 106, which provides timing signals to both pluralities of driver and receiver channels. At least one of the timing signals typically specifies the beginning of each test cycle, which defines a reference from which timing delays are calculated.

Further, a plurality of tester pins connects the driver channels to primary inputs of a board under test (BUT) 116, and another plurality of tester pins connects the receiver channels to primary outputs of the BUT 116. In particular, a tester pin 112 connects a driver channel 108 to a primary input of BUT 116, and a tester pin 114 connects a receiver channel 110 to a primary output of the BUT 116.

The driver channels include driver circuitry, which apply test signals (also known as stimulus patterns) to the primary inputs. Also, the receiver channels include comparator circuitry for receiving and measuring output signals (also known as output patterns) at the primary outputs, which are produced by the BUT 116 in response to the stimulus patterns. Both the stimulus patterns and the output patterns are applied and received, respectively, in accordance with the data value, timing, and format information provided by the test vectors.

The tester 100 detects faults in the BUT 116 whenever the received patterns do not match expected patterns, which would be produced by a properly functioning BUT. The expected patterns are also specified in the information provided by the test vectors.

Further, the detected faults typically include, but are not limited to, indications of electrical nodes of the BUT 116 that are either "stuck-at-1" or "stuck-at-0," nodes having high capacitance values that might cause slow response times, open connections between nodes, and shorted nodal connections.

The tester 100, including the computer work station 102, the sequencer 104, the timing generator 106, the driver channel 108, the receiver channel 110, and the tester pins 112 and 114, is known to those skilled in this art.

In the preferred embodiment, the test engineer develops the test programs on the computer work station 102 using a simulator and a fault simulator, which take the form of computer programs executed by the computer work station 102, such as the programs included in the LASAR™ test program development software, sold by TERADYNE®, Inc., Boston, Mass. The simulator is generally used for simulating logic functionality of a BUT. Further, the fault simulator is generally used for determining whether particular test patterns can successfully detect faults in the BUT.

First, a description of the BUT 116 is loaded into a circuit database (not shown) included in the computer work station 102. The description of the BUT 116 generally takes the form of a netlist including a list of devices attached to the BUT 116 and information on how the devices are interconnected. Further, the description of the BUT 116 also generally includes information on how each device operates, which is typically included in a library stored in the computer work station 102.

Next, a stimulus pattern is specified. Both the description of the BUT 116 and the stimulus pattern must be in forms that are compatible with the simulator and fault simulator programs.

The specified stimulus pattern is then applied as an input to the simulator, which then uses the stimulus pattern and the description of the BUT 116 for producing an output pattern. Because the simulator simulates the logic functionality of the BUT 116, the output pattern reflects logic states that would be expected to appear at the primary outputs of the BUT 116 if a corresponding stimulus pattern were applied to the primary inputs of the BUT 116.

For example, a BUT generally includes both combinatorial and sequential logic circuitry. Accordingly, individual stimulus patterns may be specified as inputs to the simulator for simulating logic functionality of selected portions of the combinatorial logic. Alternatively, series of stimulus patterns may be specified for simulating logic functionality of selected portions of the sequential logic. As a result, the simulator produces output patterns that would be expected to appear at the primary outputs of the BUT 116 if corresponding stimulus patterns were applied to the primary inputs of the BUT 116 for stimulating the selected combinatorial and sequential logic.

Next, another computer program, such as the INJECTOR™ program included in the LASAR™ test program development software, uses the description of the BUT 116 for creating an initial list of types and locations of potential faults in the BUT 116.

The fault simulator program then uses the specified stimulus pattern, the expected output pattern, the initial list of potential faults, and the description of the BUT 116, for measuring the effectiveness of the specified stimulus pattern. This is done by determining whether the specified stimulus pattern can successfully detect at least one of the potential faults in the BUT 116.

For example, if the fault simulator determines that the specified stimulus pattern can control an electrical node of the BUT 116 where one of the potential faults occurs, and that the controlled node can be observed at one of the primary outputs of the BUT 116, then the specified stimulus pattern can be used for detecting that potential fault. The fault simulator typically determines that a potential fault is detected whenever the potential fault causes the observed primary outputs not to match the expected output pattern.

Next, the specified stimulus pattern and the expected output pattern are preferably saved in a test database 118 included in the computer work station 102. Another list of types and locations of potential faults that are currently undetected is then preferably created.

The acts of applying specified stimulus patterns as inputs to the simulator for producing expected output patterns, and determining whether the specified stimulus patterns can successfully detect the potential faults in the BUT 116, are then preferably repeated until a desired fault coverage is attained. This generally occurs when the most recent list of potential faults contains the smallest acceptable number of undetected faults in the BUT 116. An important advantage of the present invention is that the desired fault coverage can be attained in less time as compared with prior art techniques.

Next, the saved stimulus and expected output patterns are converted to a form that is compatible with the tester 100, thereby developing a test program that can be used by the tester 100 for subsequent testing of the BUT 116.

The loading of the description of the BUT 116, the specifying of stimulus patterns, the applying of the stimulus patterns to the simulator program, the creating of lists of potential faults, the measuring of the effectiveness of the stimulus patterns, and the saving of stimulus patterns and expected output patterns that can be used for detecting potential faults are described above to introduce some of the general concepts that are used in the method of the present invention. A more detailed description of these and other concepts is included in the following description of the preferred embodiment of the method for generating test patterns, which is implemented in accordance with the procedure shown in FIGS. 2A through 2C.

First, as shown in FIG. 2A, a description of the BUT is loaded into a circuit database included in a computer work station in block 200. The description of the BUT preferably includes descriptions of circuit elements, how the circuit elements are interconnected, information on valid and invalid logic states for portions of the BUT that include sequential logic, information on timing requirements for portions of the BUT that receive control signals and system clock signals, and locations of primary inputs and primary outputs.

The primary inputs for the BUT typically include inputs for signals carried by a control bus, a data bus, and/or an address bus; and, system clock signals. Further, for a printed circuit board, the primary inputs and primary outputs are typically accessed via one or more edge connectors attached to the printed circuit board. Alternatively, for semiconductor devices, the primary inputs and primary outputs are typically accessed via a plurality of pins attached to the device.

Next, an initial list of types and locations of potential faults in the BUT is created in block 202 in the manner mentioned above.

A test pattern template is then defined in block 206. As described above, a test pattern set generally consists of a plurality of test vectors, with each test vector generally providing both information about test signals applied to a BUT and information about output signals that are expected to be produced by the BUT in response to the applied test signals during one cycle of operation of a tester.

In contrast, only selected primary inputs are fully specified in the test pattern template, and remaining primary inputs are specified in the template in accordance with rules that are defined by the test engineer.

In the preferred embodiment, the test engineer focuses upon a selected area of the BUT when defining the test pattern template. This generally simplifies the definition of the test pattern template and decreases time required for performing the method of the present invention. In particular, the test engineer uses the list of potential faults created in block 202 in conjunction with the primary inputs identified in block 200 for guidance in selecting an area of the BUT. Those areas of the BUT that have relatively high concentrations of potential faults, and nodes that are either directly or indirectly accessible via the primary inputs/outputs, are generally the best candidates for selection.

The test pattern template is then defined so that the selected area of the BUT traces through a complete sequence of valid states. This is because the selected area generally includes sequential logic in addition to combinatorial logic.

The test engineer preferably defines the test pattern template so that system clock signals and/or signals on a control bus are fully specified for the selected area of the BUT. For example, the test engineer may specify a system clock as having a frequency of 100 MHz and a 50% duty cycle. Further, signals on a control bus typically include read and write signals for initiating input and output operations, and signals for initiating reset operations. Accordingly, the test engineer may define the test pattern template so that appropriate clock sequences are performed for the system clock, and appropriate control sequences are performed for the input/output operations and the reset operations, each of which may be required by the selected area for tracing through a complete sequence of valid states.

The test engineer also preferably defines the test pattern template for guiding the specification of the remaining primary inputs, which typically include, but are not limited to, signals on a data bus and/or an address bus. Further, the specification of the remaining primary inputs is typically performed in accordance with the rules specified by the test engineer.

In the preferred embodiment, the test engineer groups related remaining primary inputs together. For example, data bus signals may be place in one group, and address bus signals may be placed in another group. This facilitates the specification of the remaining primary inputs.

In particular, the following format is preferably used for specifying each group:

---

GROUP <Group name><Group type>
    <Optional minus sign><Primary input name>
    <Optional minus sign><Primary input narne>
    .
    .
    .
    <Optional minus sign><Priimary input name>
END.

---

The designation, "GROUP," indicates that a group of primary inputs is being defined. Further, as described above, the test engineer may place data bus signals in one group, and address bus signals in another group. Accordingly, the "Group name" for the data bus signal group may be specified as "DATA," and the Group name for the address bus signal group may be specified as "ADDRESS." Because a first test pattern template may be used for defining the groups, subsequent test pattern templates may then refer to the defined groups by simply using the specified group names, DATA and ADDRESS.

Also, the "Primary input name" designations may be used for identifying the primary inputs in the DATA group and the ADDRESS group. Typical primary input names for the DATA group may include "D0" through "D$_N$," where N is equal to the total number of primary inputs in the DATA group minus one. Similarly, typical primary input names for the ADDRESS group may include "A0" through "A$_M$," where M is equal to the total number of primary inputs in the ADDRESS group minus one.

Also, the "Optional minus sign" relates to the symbol, "−", which is optionally placed before each primary input name. In the preferred embodiment, the "base state" of a primary input that is preceded by the "−" symbol has a "low" logical value, and the base state of a primary input that is not preceded by the "−" symbol has a "high" logical value. Further, the initial states for the primary inputs in each defined group are the base states.

Also, the "Group type" relates to the rules used for specifying the data bus signals and the address bus signals. In particular, the data bus signals can be used for making data transfers to and from memory in the BUT or other devices, and the address bus signals can be used for designating sources and targets of the data transfers. Accordingly, different rules are generally required for specifying the primary inputs in each group.

For example, it is often useful to specify the primary inputs in the defined groups in accordance with predetermined series of codes. One useful code is the well-known Gray code, in which two consecutive integers differ only by a single bit. The following is a typical series of integers that follows the Gray code: 0000, 0001, 0011, 0010, 0110, 0111, 0101, 0100, 1100, 1101, 1111, 1110, 1010, 1011, 1001, and 1000. Further, the maximum number of integers in the series is generally equal to $2^n$, where "n" is the total number of primary inputs in the group.

The test engineer typically uses the Gray code when every possible combination of the states for the primary inputs in the group, or some subset thereof, is specified during the test. For example, the test engineer may use the Gray code with the DATA group. Accordingly, the "Group type" for the DATA group may be specified as "COUNT_GRAY."

Another useful code is a "ripple" code, in which the states for the primary inputs in the group are the same as the base states except for one primary input which is inverted. The following is a typical series of integers that follows the ripple code: 00000000, 00000001, 00000010, 00000100, 00001000, 00010000, 00100000, 01000000, and 0000000. Accordingly, the maximum number of integers in the series is generally equal to the total number of primary inputs in the group plus one.

The test engineer typically uses the ripple code when the state for one or more of the primary inputs in the group fluctuates between a low logical value and a high logical value. For example, the test engineer may use the ripple code with the ADDRESS group. Accordingly, the "Group type" for the ADDRESS group may be specified as "RIPPLE."

As an illustrative example, the following formats are preferably used for specifying the DATA group and the ADDRESS group:

```
GROUP DATA COUNT_GRAY
    -D3 -D2 -D1 -D0
    END
GROUP ADDRESS RIPPLE
    -A7 -A6 -A5 -A4 -A3 -A2 -A1 -A0
    END
```

The test pattern template is then converted into a first stimulus pattern in block 208. In particular, the defined test pattern template is converted into the first stimulus pattern by assigning appropriate states to the primary inputs corresponding to system clock signals and/or signals on a control bus, and by assigning states to the remaining primary inputs, which may include the primary inputs in both the DATA group and the ADDRESS group as described above. For example, the remaining primary inputs in the first stimulus pattern are preferably assigned states corresponding to the first integer in the predetermined series of codes, such as the Gray code or the ripple code described above.

Next, the first stimulus pattern is applied as an input to the simulator in block 209 for producing a first expected output pattern as described above.

Fault simulation is then performed in block 210 using the initial list of potential faults, the first stimulus pattern, the first expected output pattern, and the description of the BUT. As described above, a fault simulator program is preferably used for determining whether at least one of the listed potential faults causes the first stimulus pattern to produce an output pattern that does not match the first expected output pattern. If so, then the first stimulus pattern can be used for detecting that fault.

Figure 2B:
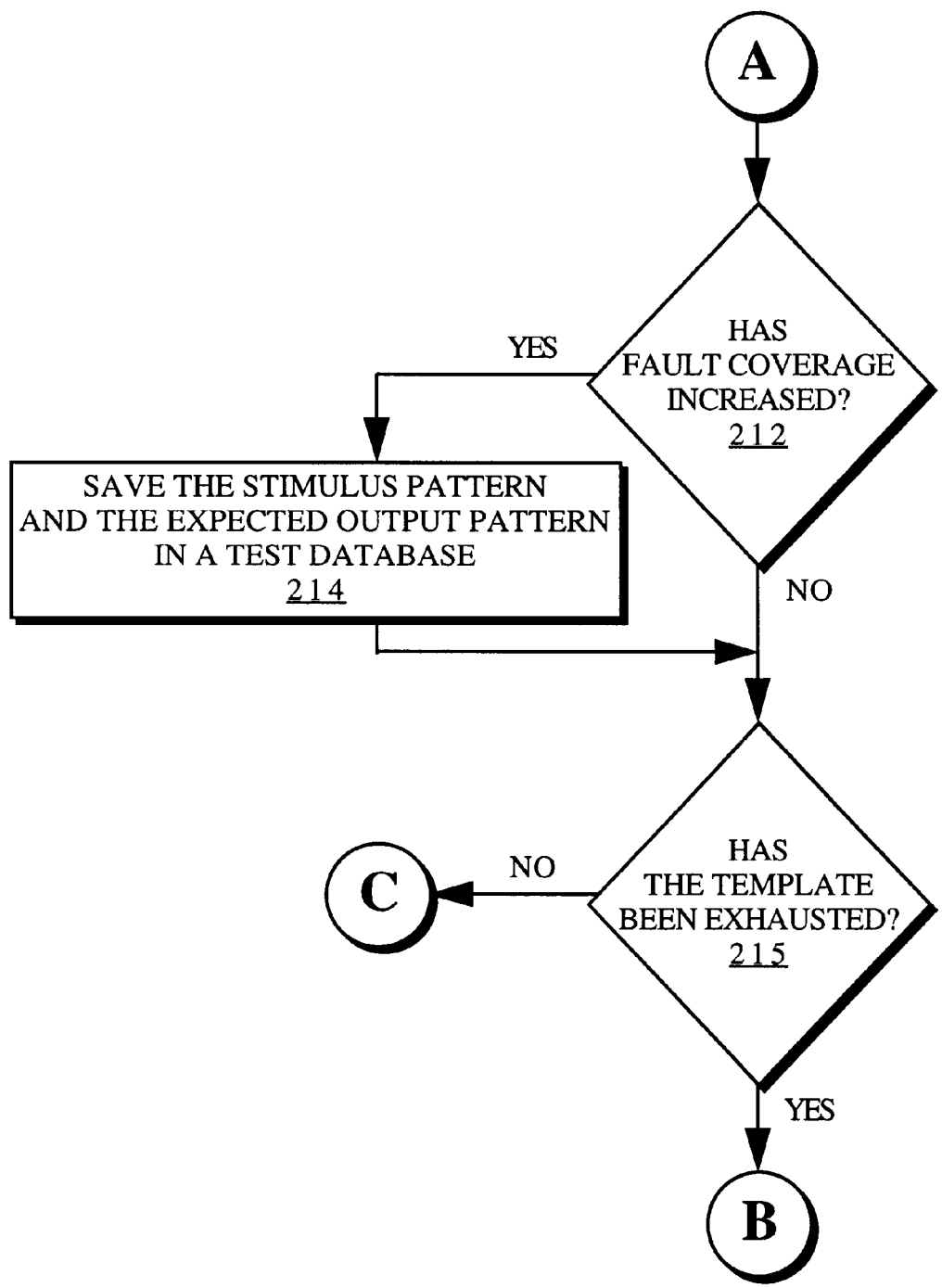

The procedure then continues to decision block 212, which is shown in FIG. 2B and determines whether fault coverage of the BUT has increased. Obviously, if the fault simulation performed in block 210 determined that the first stimulus pattern successfully detected one of the listed faults, then the fault coverage has increased.

However, subsequent passes through the method for generating test patterns require decision block 212 to verify that newly detected faults have not already been detected using prior stimulus patterns. Accordingly, if the stimulus pattern successfully detected one of the listed faults, and that fault had not already been detected by a prior stimulus pattern, then the fault coverage of the BUT has increased.

If the fault coverage of the BUT has increased, then the stimulus pattern and its related expected output pattern are then saved in block 214. As mentioned above, the stimulus pattern and its related expected output pattern are preferably saved in a test database included in the computer work station.

The procedure then continues to decision block 215, which determines whether the defined test pattern template has been exhausted. This means that the remaining primary inputs in the stimulus pattern have successively been assigned states corresponding to every integer in the predetermined series of codes.

If the defined test pattern template has not been exhausted, then the procedure branches back to block 208, which converts the test pattern template into another stimulus pattern by assigning appropriate states to the primary inputs corresponding to system clock signals and/or signals on a control bus, and by assigning states to the remaining primary inputs corresponding to the next integer in the predetermined series of codes.

Figure 2C:
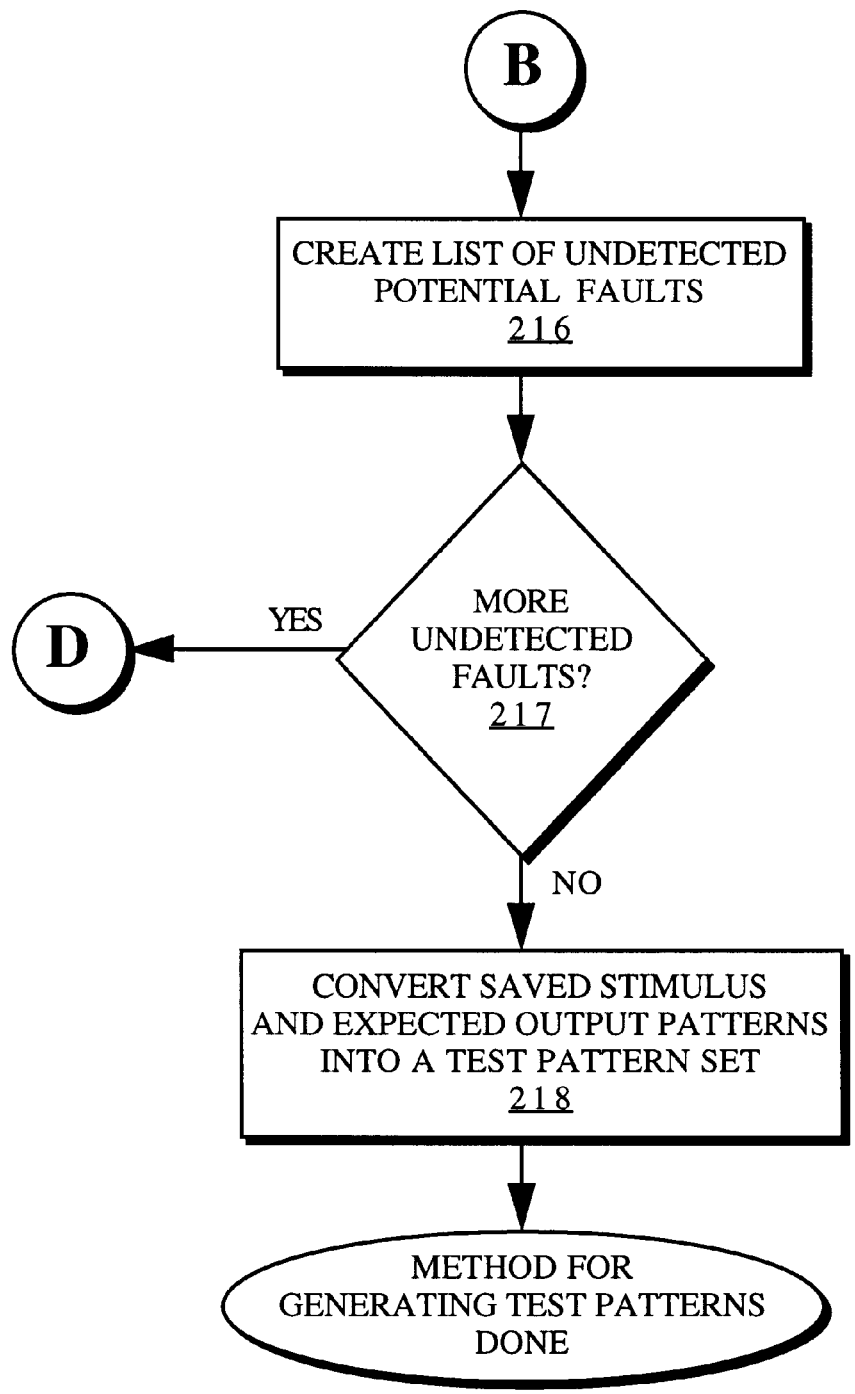

Otherwise, the procedure continues to block 216, which is shown in FIG. 2C and creates a list of types and locations of potential faults in the BUT that have not yet been detected. This list is created in the same manner as the list created in block 202.

Next, the procedure continues to decision block 217, which determines whether there are still some undetected potential faults in the BUT. This is done by analyzing the list created in block 216.

If there are still some potential faults that are as yet undetected, then the procedure generally branches back to block 206 for defining a new test pattern template. In particular, if the analysis of the list created in block 216 shows that the undetected potential faults are located in the same selected area of the BUT, then the new test pattern template is defined for additional testing of the selected area. Alternatively, if the undetected potential faults are located outside the selected area, then a new area is selected for testing using the criteria described above, which include concentrations of undetected faults and nodes that are either directly or indirectly accessible via the primary inputs/outputs.

Finally, if it is determined that there are no undetected potential faults in the BUT, or if the test engineer decides that the desired fault coverage has been attained, then the procedure continues to block 218, which converts the saved stimulus patterns and related expected output patterns into a test pattern set that is compatible with the tester used for subsequently testing the BUT, thereby completing the procedure for generating test patterns.

It follows from the above description that the present invention offers advantages over earlier methods for generating test patterns. First, test pattern templates are defined, which can be used as guides for specifying stimulus patterns and for specifying how to test the BUT. Further, the test pattern templates include information on specific states for some primary inputs, and rules for specifying states for other primary inputs.

This means that all possible input combinations might be applied to one group of primary inputs, while a selected subset of the possible input combinations might be applied to another group of primary inputs. As a result, the total number of input combinations required for generating the test patterns can be significantly reduced.

Also, the test engineer can use schematics of the BUT and his or her own knowledge of how the BUT operates for defining the test pattern templates. This typically results in the generation of test patterns that specifically target and thoroughly exercise the selected areas of the BUT. As a result, the time required to detect the potential faults, including the "difficult faults," can also be significantly reduced.

Also, the test pattern sets generated using the method of the present invention can be saved and used for subsequent testing of the BUT.

Having described one embodiment, numerous alternative embodiments or variations might be made. For example, it was described that each test pattern set includes one or more test vectors. These test vectors may be generated in accordance with any format including, but not limited to, IEDEC, BSDL, and HSDL.

Also, it was described that a description of a BUT is loaded into a circuit database included in the computer work station 102. However, this was merely an illustration. A description of a DUT might alternatively be loaded into the circuit database. Further, the description of the BUT or DUT may be entered using any appropriate schematic entry language or high-level behavioral language including, but not limited to, VHDL and VERILOG.

Also, it was described that the test pattern templates are defined so that the selected areas trace through complete sequences of valid states. However, this was also merely an illustration. The test pattern template might be defined so that a particular selected area traces through one or more invalid states in order to simulate a particular fault condition.

Also, it was described that the test engineer defines the test pattern template so that system clock signals and/or control bus signals are fully specified, while data bus signals and/or address bus signals are specified in accordance with rules formulated by the test engineer. However, this too was merely an illustration. The test engineer may specify the signals in alternate ways for thoroughly exercising the BUT.

Also, it was described that the primary inputs in the defined groups may be specified in accordance with the Gray code and the ripple code. The test engineer may alternatively choose other useful codes or rules for guiding the way the primary inputs are specified.

It will therefore be understood by those skilled in this art that additions, deletions, and modifications can be made to the preferred embodiment described herein, without departing from the spirit and scope of the appended claims.

What is claimed is:

1. A method for generating test patterns for detecting faults in a digital electronic circuit, comprising the steps of:
   (a) defining a test pattern template for exercising at least a portion of the digital electronic circuit, the test pattern template including a first sequence of test patterns that are fully specified for a first plurality of inputs to produce a desired test condition, and a second sequence of test patterns that are generated automatically for a second plurality of inputs in accordance with a predetermined series of codes;
   (b) converting the test pattern template into a stimulus pattern;
   (c) simulating the digital electronic circuit using the stimulus pattern for producing an expected output pattern;
   (d) performing fault simulation of the digital electronic circuit using the stimulus pattern and the expected output pattern; and
   (e) if fault coverage increases, saving the stimulus pattern and the expected output pattern.

2. The method for generating test patterns as recited in claim 1, further comprising the step of identifying potential faults for the digital electronic circuit.

3. The method for generating test patterns as recited in claim 2, wherein the defining in step (a) further includes the substep of selecting an area of the digital electronic circuit, wherein the selected area includes some of the identified potential faults.

4. The method for generating test patterns as recited in claim 1, wherein the first plurality of inputs includes
   system clock signals and/or control bus signals, and wherein the second plurality of inputs includes
   data bus signals and/or address bus signals.

5. The method for generating test patterns as recited in claim 1, wherein the defining in step (a) comprises the substeps of
   (a1) identifying at least one set of related inputs in the second plurality of inputs, and
   (a2) grouping the at least one set of related inputs, wherein each group of related inputs is specified in accordance with a different predetermined series of codes.

6. The method for generating test patterns as recited in claim 5, wherein the predetermined series of codes is a Gray code.

7. The method for generating test patterns as recited in claim 5, wherein the predetermined series of codes is a ripple code.

8. The method for generating test patterns as recited claim 1, wherein the converting in step (b) comprises the substeps of
   (b1) assigning states to each input in the first sequence of test patterns, and
   (b2) assigning states to each input in the second sequence of test patterns in accordance with an integer in the predetermined series of codes.

9. The method for generating test patterns as recited in claim 8, further comprising the step of
   (f) if the plurality of test patterns has not been exhausted, optionally repeating steps (b) through (e),
      wherein the plurality of test patterns is exhausted when states have been successively assigned to each input in the second plurality of inputs in accordance with every integer in the predetermined series of codes.

10. The method for generating test patterns as recited in claim 1, wherein the performing in step (d) comprises the substeps of
    (c1) fault simulating the digital electronic circuit for determining whether at least one of a plurality of potential faults is detected, and
    (c2) creating a list of undetected potential faults.

11. The method for generating test patterns as recited in claim 10, wherein the fault coverage increases when the number of undetected potential faults in the list of undetected potential faults decreases.

12. The method for generating test patterns as recited in claim 10, further comprising the step of (f) if the number of undetected potential faults in the list of undetected potential faults is greater than or equal to one, optionally repeating steps (a) through (e).

13. The method for generating test patterns as recited in claim 1, wherein the saving in step (e) comprises the substep of saving the stimulus pattern and the expected output pattern in a test database.

14. An apparatus for generating test patterns for detecting faults in a digital electronic circuit, comprising:

means for defining a test pattern template for exercising at least a portion of the digital electronic circuit, the test pattern template including a first sequence of test patterns are fully specified for a first plurality of inputs, and a second sequence of test patterns are generated automatically for a second plurality of inputs in accordance with a predetermined series of codes;

means for converting the test pattern template into a stimulus pattern;

means for simulating the digital electronic circuit using the stimulus pattern for producing an expected output pattern;

means for performing fault simulation of the digital electronic circuit using the stimulus pattern and the expected output pattern; and a test database for storing the stimulus pattern and the expected output pattern.

15. The apparatus for generating test patterns as recited in claim 14, further comprising means for identifying potential faults for the digital electronic circuit.

16. The apparatus for generating test patterns as recited in claim 15, wherein the means for defining comprises means for selecting an area of the digital electronic circuit, wherein the selected area includes some of the identified potential faults.

17. The apparatus for generating test patterns as recited in claim 14, wherein the means for defining comprises means for identifying at least one set of related inputs in the second plurality of inputs, and means for grouping the at least one set of related inputs, wherein each group of related inputs is specified in accordance with a different predetermined series of codes.

18. The apparatus for generating test patterns as recited in claim 14, wherein the means for converting comprises means for assigning states to each input in the first plurality of inputs in accordance with the first sequence of test patterns, means for assigning states to each input in the second plurality of inputs in accordance with an integer in the predetermined series of codes.

19. The apparatus for generating test patterns as recited in claim 14, wherein the means for performing comprises means for fault simulating the digital electronic circuit for determining whether at least one of a plurality of potential faults is detected, and means for creating a list of undetected potential faults.

20. A method for generating test patterns for detecting faults in a digital electronic circuit, comprising the steps of:

(a) grouping input nodes of the digital electronic circuit to be simulated into a first plurality of inputs and a second plurality of inputs;

(b) accepting information that specifies a first sequence of test patterns for the first plurality of inputs; and (c) computer-generating a second sequence of test patterns for the second plurality of inputs; and (d) combining the first and second sequences to form a plurality of test patterns.

21. The method of claim 20, wherein the first sequence of test patterns is prearranged to exercise a predetermined function of the digital electronic circuit.

22. The method of claim 20, wherein the second sequence of test patterns is one of a number of predetermined numerical sequences automatically generated by computer.

23. The method of claim 20, wherein the first plurality of inputs correspond to mode control and clock signals of the digital electronic circuit.

24. The method of claim 23, wherein the digital electronic circuit is one of a family of digital electronic circuits of a same type, and further comprising reusing the first sequence of inputs for other digital electronic circuits of the same type.

* * * * *